US011145369B2

(12) United States Patent
Qawami et al.

(10) Patent No.: US 11,145,369 B2
(45) Date of Patent: Oct. 12, 2021

(54) APPARATUSES AND METHODS FOR ADJUSTING WRITE PARAMETERS BASED ON A WRITE COUNT

(71) Applicant: MICRON TECHNOLOGY, INC., Boise, ID (US)

(72) Inventors: Shekoufeh Qawami, El Dorado Hills, CA (US); Rajesh Sundaram, Folsom, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/832,061

(22) Filed: Mar. 27, 2020

(65) Prior Publication Data

US 2020/0227116 A1    Jul. 16, 2020

Related U.S. Application Data

(63) Continuation of application No. 14/927,329, filed on Oct. 29, 2015.

(51) Int. Cl.
  *G06F 12/08* (2016.01)
  *G11C 14/00* (2006.01)
  (Continued)

(52) U.S. Cl.
  CPC ............ *G11C 14/0045* (2013.01); *G11C 7/24* (2013.01); *G11C 8/18* (2013.01); *G11C 13/0004* (2013.01);
  (Continued)

(58) Field of Classification Search
  CPC ... G06F 3/0619; G06F 3/0659; G06F 12/0246
  (Continued)

(56) References Cited

U.S. PATENT DOCUMENTS

7,058,665 B1 *  6/2006  Lang ..................... G06F 3/0619
7,058,668 B2    6/2006  Edlund et al.
(Continued)

FOREIGN PATENT DOCUMENTS

CN    1530839 A    9/2004
CN    102543154 A    7/2012
(Continued)

OTHER PUBLICATIONS

EP Office Action dated Apr. 3, 2020 for EP Application No. 16860514.5, 6 pgs.
(Continued)

*Primary Examiner* — Mohamed M Gebril
(74) *Attorney, Agent, or Firm* — Dorsey & Whitney LLP

(57) ABSTRACT

According to one embodiment of the present invention, an apparatus is disclosed. The apparatus includes a memory array having a plurality of memory cells. The apparatus further includes memory access circuits coupled to the memory array and configured to perform write operations responsive to control signals. The apparatus further includes control logic coupled to the memory access circuits and configured to apply a set of write parameters based, at least in part, on a number of write operations performed by the memory access circuits and further configured to provide control signals to the memory access circuits to perform write operations on the plurality of memory cells according to the set of write parameters.

21 Claims, 6 Drawing Sheets

(51) Int. Cl.
  *G11C 13/00* (2006.01)
  *G11C 16/10* (2006.01)
  *G11C 16/34* (2006.01)
  *G11C 7/24* (2006.01)
  *G11C 8/18* (2006.01)

(52) U.S. Cl.
  CPC ...... *G11C 13/0035* (2013.01); *G11C 13/0069* (2013.01); *G11C 16/10* (2013.01); *G11C 16/349* (2013.01); *G11C 16/3495* (2013.01); *G06F 2212/7211* (2013.01); *G11C 2013/0092* (2013.01); *G11C 2213/71* (2013.01)

(58) Field of Classification Search
  USPC .......................................................... 711/114
  See application file for complete search history.

(56) References Cited

U.S. PATENT DOCUMENTS

| | | | | |
|---|---|---|---|---|
| 7,085,161 | B2* | 8/2006 | Chen | G06F 11/1068 365/185.02 |
| 7,948,798 | B1* | 5/2011 | Sheredy | G06F 3/0616 365/185.11 |
| 8,135,913 | B1* | 3/2012 | Sheredy | G06F 3/0616 711/118 |
| 8,250,293 | B2* | 8/2012 | Happ | G11C 11/1673 711/103 |
| 2003/0151950 | A1 | 8/2003 | Tamada et al. | |
| 2006/0282610 | A1 | 12/2006 | Dariel et al. | |
| 2006/0291291 | A1* | 12/2006 | Hosono | G11C 16/3454 365/185.22 |
| 2007/0127279 | A1* | 6/2007 | Suyama | G11C 16/26 365/1 |
| 2009/0103371 | A1 | 4/2009 | Goda et al. | |
| 2010/0054018 | A1* | 3/2010 | Kajigaya | G11C 13/0007 365/148 |
| 2010/0124122 | A1 | 5/2010 | Jeong et al. | |
| 2010/0205356 | A1* | 8/2010 | Mukaida | G06F 12/0246 711/103 |
| 2011/0051521 | A1 | 3/2011 | Levy et al. | |
| 2012/0002470 | A1 | 1/2012 | Futatsuyama et al. | |
| 2012/0011301 | A1* | 1/2012 | Goss | G11C 16/10 711/103 |
| 2012/0239858 | A1* | 9/2012 | Melik-Martirosian | G11C 16/12 711/103 |
| 2012/0243321 | A1 | 9/2012 | Shinagawa | |
| 2013/0033929 | A1* | 2/2013 | Kim | G11C 13/0028 365/163 |
| 2013/0188431 | A1 | 7/2013 | Scheuerlein et al. | |
| 2013/0254508 | A1* | 9/2013 | Patil | G06F 3/0674 711/170 |
| 2013/0258775 | A1 | 10/2013 | Neo et al. | |
| 2014/0029342 | A1* | 1/2014 | Huang | G11C 16/3495 365/185.12 |
| 2014/0156921 | A1* | 6/2014 | Schuette | G06F 3/0679 711/103 |
| 2014/0229774 | A1 | 8/2014 | Melik-Martirosian | |
| 2014/0237286 | A1* | 8/2014 | Jung | G06F 11/073 714/6.13 |
| 2014/0281162 | A1 | 9/2014 | Dai et al. | |
| 2014/0353568 | A1* | 12/2014 | Boniardi | H01L 45/1608 257/4 |
| 2015/0016185 | A1* | 1/2015 | King Liu | G11C 11/36 365/175 |
| 2015/0113207 | A1* | 4/2015 | Shin | G06F 12/0246 711/103 |
| 2015/0162174 | A1* | 6/2015 | Badiei | H01J 49/0009 250/288 |
| 2015/0213891 | A1 | 7/2015 | Fantini et al. | |
| 2015/0262659 | A1 | 9/2015 | Cometti et al. | |
| 2016/0070643 | A1* | 3/2016 | Shen | G11C 16/349 711/103 |
| 2016/0188212 | A1* | 6/2016 | Camp | G06F 3/0688 711/171 |
| 2016/0203864 | A1* | 7/2016 | Qawami | G11C 13/0033 365/163 |
| 2017/0125099 | A1 | 5/2017 | Qawami et al. | |

FOREIGN PATENT DOCUMENTS

| | | |
|---|---|---|
| JP | 2002133887 A | 5/2002 |
| JP | 2003242787 A | 8/2003 |
| JP | 2012203951 A | 10/2012 |
| KR | 100191096 B1 | 6/1999 |
| KR | 20000052493 A | 8/2000 |
| KR | 101087308 B1 | 3/2012 |
| KR | 20120030817 A | 3/2012 |

OTHER PUBLICATIONS

English Translation of First Office Action for Korean Application No. 10-2018-7014407 dated Aug. 29, 2019, pp, all.
JP Office Action dated Jun. 11, 2019 for Application No. 2018-521640, 16 pgs.
Extended European Search Report dated May 24, 2019 for European Application No. 16860514.5, 7 pages, pp. all.
International Search Report and Written Opinion Received PCT Appl. No. PCT/US2016/057488 dated Jan. 31, 2017; pp. all.
CN Office Action dated Jul. 29, 2020 for CN Application No. 201680070981.4, pp. all.
English translation of Office Action for CN Application No. 201680070981.4, dated Jun. 7, 2021, pp. all.

* cited by examiner

| | 0 | 1 | 2 | 3 |
|---|---|---|---|---|
| Max | $10^4$ | $10^5$ | $10^6$ | $10^7$ |
| Min | 0 | $10^3$ | $10^4$ | $10^5$ |

FIG. 4

APPARATUSES AND METHODS FOR ADJUSTING WRITE PARAMETERS BASED ON A WRITE COUNT

CROSS REFERENCE TO RELATED APPLICATION(S)

This application is a continuation of U.S. patent application Ser. No. 14/927,329 filed Oct. 29, 2015 and issued as U.S. Pat. No. 10,643,700 on May 5, 2020. The aforementioned application, and issued patent, is incorporated herein by reference, in its entirety, for any purpose.

BACKGROUND

Non-volatile memory devices can be read from and written to in order to retrieve and store information. One type of non-volatile memory device is phase change memory, which may be arranged in a three dimensional (3D) cross-point architecture. In phase change memory devices, each memory cell is formed from a material that can be selectively transformed from one phase to another. For example, the material may be transformed from an amorphous state to a crystalline state by applying write voltages to the memory cell. Different states have different electrical properties, and can be sensed by applying a voltage to the material which, based on the present state of the material, results in a different electrical current being conducted through the cell. Therefore, selectively applying write voltages to the memory cells to set the material state provides a mechanism for storing bits of data which can later be read by applying a sensing voltage to the cell. While non-volatile memory devices have the benefit of retaining the stored information even when power is removed from the device, such devices typically suffer from limited write endurance and retention. That is, repeated accesses to the memory cells for read and write operations exert stresses on the components and memory cells of the device. As a result, memory devices can undergo physical changes and degradation over the life of the device.

BRIEF DESCRIPTION OF THE DRAWINGS

FIG. 4 is an example parameter table, in accordance with an embodiment of the present invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments described herein recognize that many memory systems have limited write endurance and, therefore, degrade over time through repeated access. In order to compensate for the physical degradation of the cells in a memory device, various physical parameters may be tuned or adjusted based on the age of the device in order to reduce the failure rate of write operations. Accordingly, there is a need for a mechanism to track the age of the device in order to selectively adjust the write parameters to account for physical degradation of the cells of the device. Write parameters can include, for example write voltages, such as the voltages applied to memory cells through word lines and/or the bit lines during a write operation. Other internal parameters can be adjusted as well. Example parameters include, but are not limited to pulse shape, leading edge, trading edge, duration, etc. In general, write parameters may include any configurable settings in the memory device that can be adjusted as the cell ages in order to improve the probability of a successful write operation. Disclosed herein are various apparatuses and methods for tracking the age of a device based on the number of write operations performed on the device, and adjusting write parameters based on the age of the device and a set of bins defined by ranges of write operations. Bins are specified ranges of the numbers of write operations. At any given point in time, the device may fit into one or more bins based on the number of write operations that have been performed on the memory device. For example, one bin may be defined by a range of between 0 and 1,000 write operations. Write operations may include programming operations, erase operations, or both.

Figure 1A:
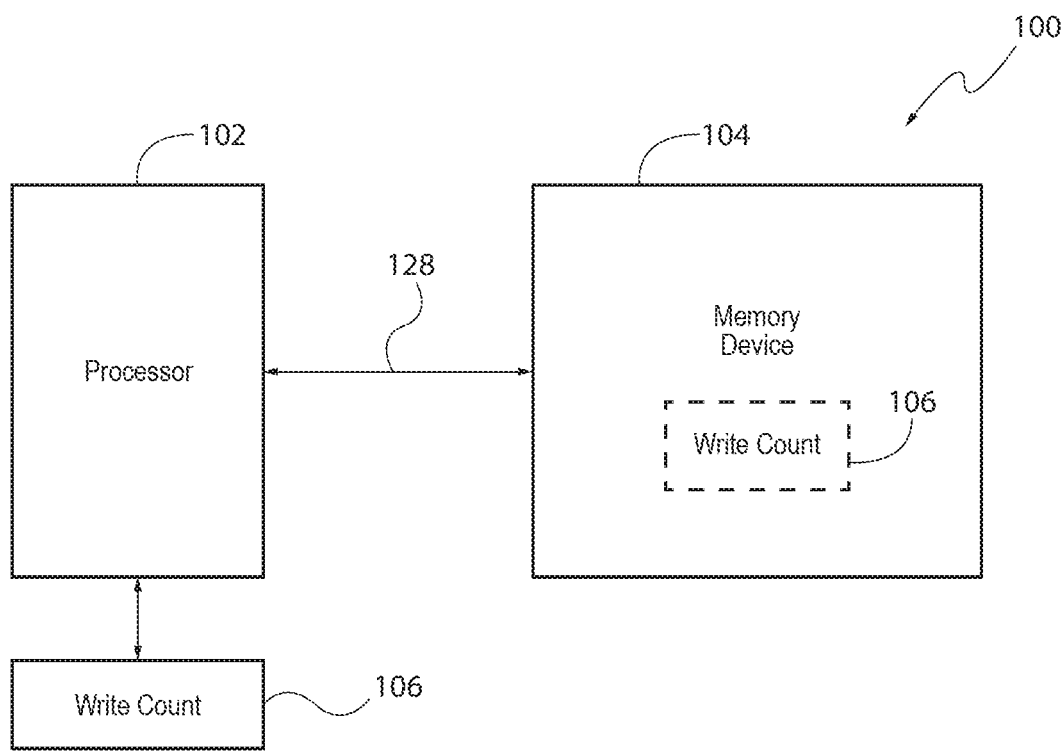
FIG. 1A is a functional block diagram of a memory system, in accordance with an embodiment of the present invention.

FIG. 1A is a functional block diagram of a memory system, generally designated 100, in accordance with an embodiment of the present invention. Memory system 100 includes a processor 102 coupled to a memory device 104. The processor 102 can be any type of controlling circuitry configured to transmit instructions to the memory device 104. In various embodiments, the processor may be one or more microprocessors, an application specific integrated circuit, or other type of controlling circuitry. The memory device 104 includes various circuits for memory operations. A discussed in further detail below with respect to FIG. 1B, the memory device 104 can include input/output (VO) control circuitry, control logic, and a memory array comprising a plurality memory cells. Commands, address information, and write data may be provided to the memory device 104 as sets of sequential input/output (I/O) transmitted through an I/O bus 128. Similarly, read data may be provided from the memory device 104 through the I/O bus 128.

The processor 102 may be further coupled to a write count circuit 106. The write count circuit 106 may be a register, a cache, or any other type of temporary memory configured to store a number of write operations executed by the memory device 104. In other embodiments, the write count circuit 106 may be a non-volatile memory configured to store the number of write operations performed by the memory device 104 when power is removed from the memory device 104. The write count circuit 106 may be configured to store a value corresponding to the current number of write operations performed by the memory device 104. The write count circuit 106 may be accessed by the processor 102 during a set write cycle bin operation in order to determine the current number of write operations that have been performed by the memory device 104. During a set write cycle bin operation, described in further detail below, the value stored in the write count circuit 106 may be used to adjust write parameters within the memory device 104 to improve the likelihood of successful write operations. Further, the processor 102 may periodically update the value stored in the write count circuit 106 to ensure that the number of write operations stored in the write count circuit 106 is consistent with the actual number of write operations that have been performed by the memory device 104. In alternative embodiments, the write count circuit 106 may be located within the memory device 104. In such embodiments, the memory device 104 may track the number of write operations performed by the memory device 104 and store the current number of write operations performed on the write count circuit 106 within the memory device 104. The memory device may access the value stored locally in the memory device 104 to determine the number of write operations performed by the memory device 104.

Figure 1B:
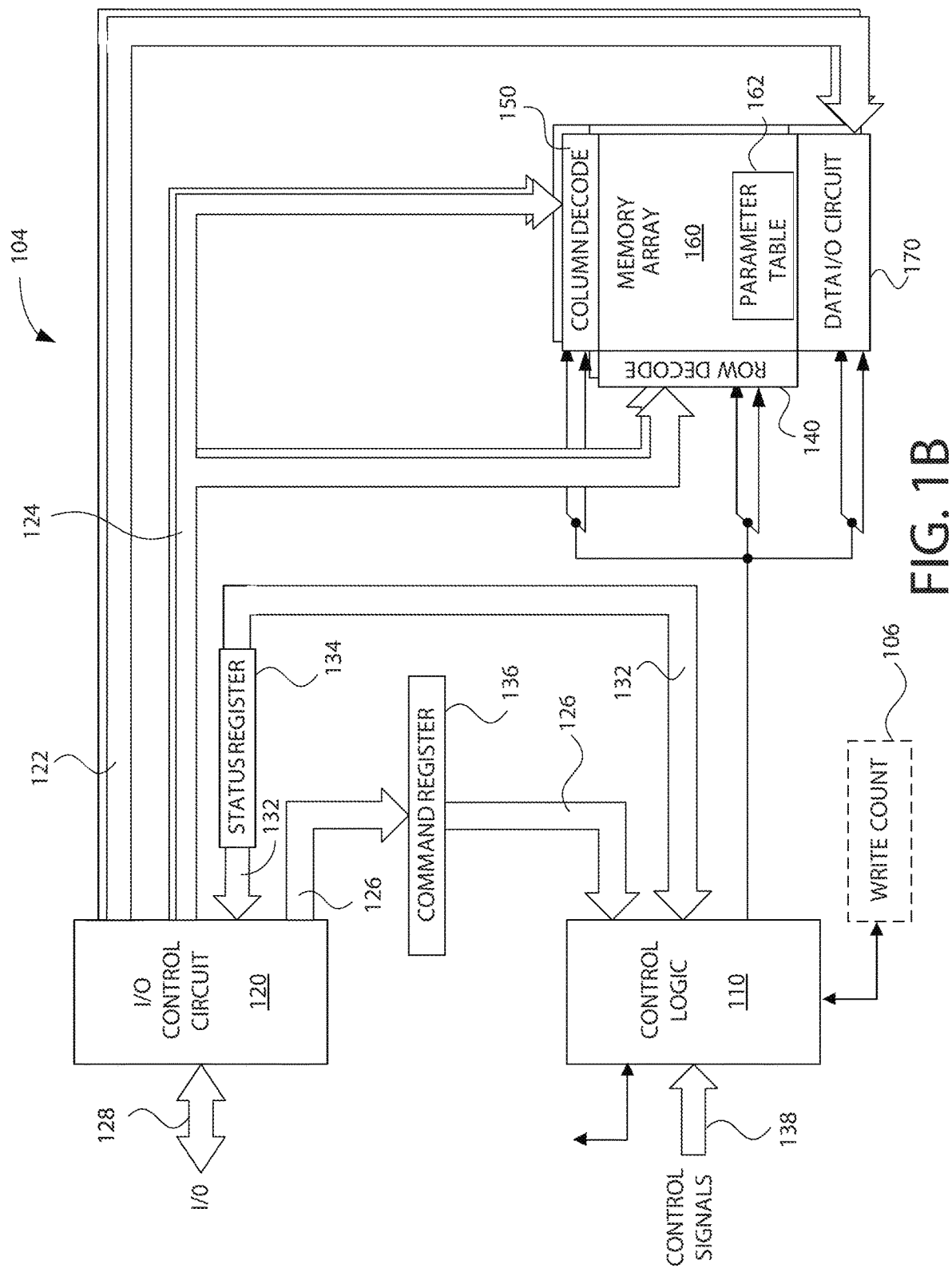
FIG. 1B is a functional block diagram of a memory device, in accordance with an embodiment of the present invention.

FIG. 1B illustrates an apparatus that includes a memory device 104 according to an embodiment of the present invention. The memory device 104 includes a memory array 160 with a plurality of memory cells that are configured to store data. The memory cells may be accessed in the array through the use of various signal lines, word lines (WLs) and/or bit lines (BLs). The memory cells may be non-volatile memory cells, such as NAND or NOR flash cells, phase change memory cells, or may generally be any type of memory cells. The memory cells of the memory array 160 can be arranged in a memory array architecture. For example, in one embodiment, the memory cells are arranged in a 3D cross-point architecture. In other embodiments, other memory array architectures may be used, for example, a single-level cross-point architecture, among others. The memory cells may be single level cells configured to store data for one bit of data. The memory cells may also be mufti-level cells configured to store data for more than one bit of data.

A data strobe signal DOS may be transmitted through a data strobe bus (not shown). The DOS signal may be used to provide timing information for the transfer of data to the memory device 104 or from the memory device 104. The I/O bus 128 is connected to an I/O control circuit 120 that routes data signals, address information signals, and other signals between the I/O bus 128 and an internal data bus 122, an internal address bus 124, and/or an internal command bus 126. The internal address bus 124 may be provided address information by the I/O control circuit 120. The internal address bus 124 may provide block-row address signals to a row decoder 140 and column address signals to a column decoder 150. The row decoder 140 and column decoder 150 may be used to select blocks of memory cells for memory operations, for example, read and write operations. The row decoder 140 and/or the column decoder 150 may include one or more signal line drivers configured to provide a biasing signal to one or more of the signal lines in the memory array 160. The I/O control circuit 120 is coupled to a status register 134 through a status register bus 132. Status bits stored by the status register 134 may be provided by the I/O control circuit 120 responsive to a read status command provided to the memory device 104. The status bits may have respective values to indicate a status condition of various aspects of the memory and its operation.

The memory device 104 also includes a control logic 110 that receives a number of control signals 138 either externally or through the command bus 126 to control the operation of the memory device 104. The control signals 138 may be implemented with any appropriate interface protocol. For example, the control signals 138 may be pin based, as is common in dynamic random access memory and flash memory (e.g., NAND flash), or op-code based. Example control signals 138 include clock signals, read/write signals, dock enable signals, etc. A command register 136 is coupled to the internal command bus 126 to store information received by the I/O control circuit 120 and provide the information to the control logic 110. The control logic 110 may further access a status register 134 through the status register bus 132, for example, to update the status bits as status conditions change. The control logic 110 may be configured to provide internal control signals to various circuits of the memory device 104. For example, responsive to receiving a memory access command (e.g., read, write), the control logic 110 may provide internal control signals to control various memory access circuits to perform a memory access operation. Specifically, the control logic may be configured to set one or more write parameters, such as a write voltage used during write operations performed on the memory array 160, based on a value stored in the write count circuit 106 and a plurality of write cycle bins (described below). The control logic 110 may be further configured to perform wear levelling operations on the memory array 160. Wear leveling operations can redistribute data stored in the memory array 160 to ensure that some memory cells are not written to significantly more than other memory cells. The control logic 110 may use static or dynamic wear leveling. The various memory access circuits are used during the memory access operation, and may generally include circuits such as row and column decoders, charge pump circuits, signal line drivers, data and cache registers. I/O circuits, as well as others.

A parameter table 162 that can be accessed by the control logic 110 may be stored in the memory array 160. The parameter table 162 includes write cycle bin information which can be used to adjust one or more write parameters based on the number of write operations that have been performed for the memory array 160. The write cycle bin information includes one or more ranges of write operations where each range defines a write cycle bin. For example, one bin may be defined by a range of 0 to 10,000 write operations. A second bin may be defined by a range of 1,000 to 100,000 write operations, and so on for additional bins. Each of the bins in the parameter table 162 may be associated with one or more write parameters. The write parameters may define settings (e.g., write voltage, pulse duration, leading edge, trailing edge, pulse shape, etc.) to be used by the memory device 104 to perform a write operation. The current number of write operations may be stored in the write count circuit 106 (FIG. 1A) and can be compared to the one or more bins in the parameter table 162 to determine the applicable bin and identify the applicable write parameters. In various embodiments, the parameter table 162 may be stored in a dedicated portion of the memory array 160. In alternative embodiments, the parameter table 162 can be stored in a separate memory area included in the memory device, a separate storage device, memory device, register, or other device accessible by the control logic 110. The parameter table is described in further detail below with respect to FIG. 4.

A data I/O circuit 170 includes one or more circuits configured to facilitate data transfer between the I/O control circuit 120 and the memory array 160 based on signals received from the control logic 110. In various embodiments, the data I/O circuit 170 may include one or more registers, buffers, and other circuits for managing data transfer between the memory array 160 and the I/O control circuit 120. For example, during a write operation, the I/O control circuit 120 receives the data to be written through the I/O bus 128 and provides the data to the data I/O circuit 170 via the internal data bus 122. The data I/O circuit 170 writes the data to the memory array 160 based on control signals provided by the control logic 110 at a location specified by the row decoder 140 and the column decoder 150. During a read operation, the data I/O circuit reads data from the memory array 160 based on control signals provided by the control logic 110 at an address specified by the row decoder 140 and the column decoder 150. The data I/O circuit provides the read data to the I/O control circuit via the internal data bus 122. The I/O control circuit 120 then provides the read data on the I/O bus 128.

Figure 2:
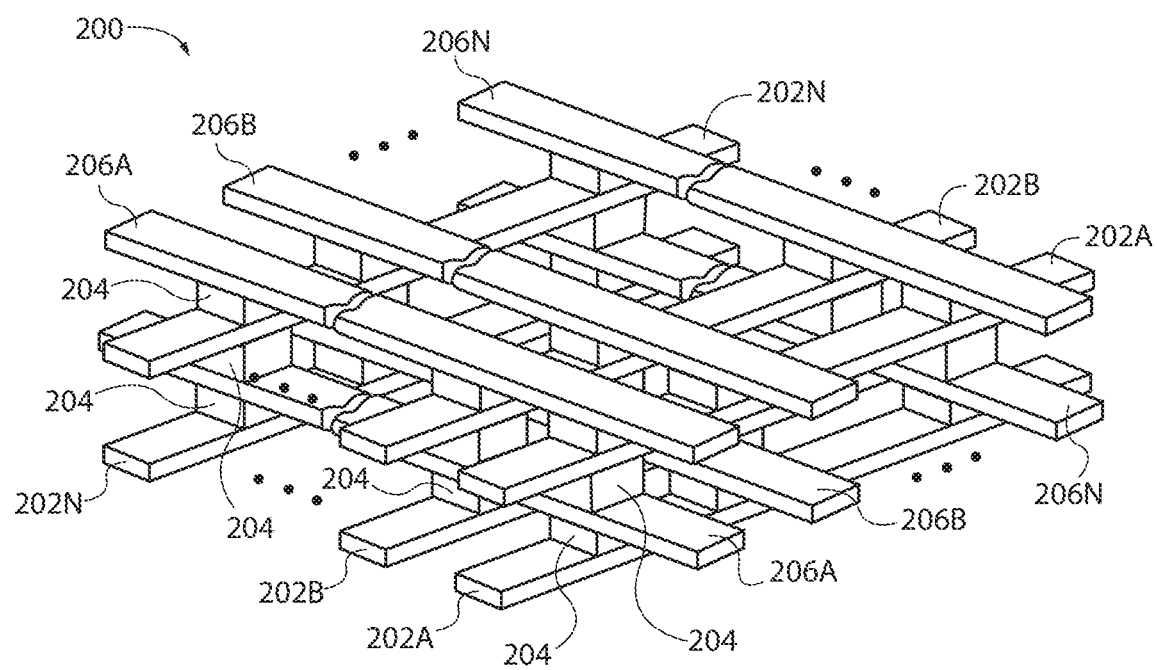
FIG. 2 is a diagram of a portion of a three-dimensional (3D) cross-point memory array, in accordance with an embodiment of the present invention.

FIG. 2 is a diagram of a portion of a 3D cross-point memory array, generally designated 200, in accordance with an embodiment of the present invention. In various embodiments, the memory array 200 can be implemented as the memory array 160 of FIG. 1B. The memory array 200 includes a first number of word lines 202A, 202B, . . . , 202N (collectively referred to as word lines 202) and a first number of bit lines 206A, 206B, . . . , 206N (collectively referred to as bit lines 206). As shown in FIG. 2, the word lines 202 may be arranged parallel to one another. The bit lines 206 can be arranged parallel to one another and orthogonal to the word lines 202. The word lines 202 and the bit lines 206 can be made from a conductive material, such as copper, tungsten, titanium, aluminum, etc. Layers or decks of word lines and bit lines can be stacked to create a 3D lattice structure. As shown in FIG. 2, layers of word lines 202 alternate with layers of bit lines 206 to form a 3D structure.

The memory array 200 includes a plurality of memory cells 204. In one embodiment, the memory cells 204 can be phase change memory cells. Each memory cell 204 is connected to a word line (e.g., word line 202A) and a bit line (e.g., bit line 206A). By connecting each memory cell to a single word line and a single bit line in a 3D cross-point array, each memory cell 204 is individually accessible by specifying a word line and a bit line, for example, by a memory address. A subset of memory cells 204 can be designated to store a parameter table, such as the parameter table 162 (FIG. 1B). In other embodiments, the parameter table 162 may be stored in separate registers. The parameter table includes a plurality of bins defined by ranges of write operations and various parameters related to write operations performed on the memory array 200. The parameter table may be accessed by control logic (e.g., control logic 110), which may set one or more write parameters that are used to write to the memory cells 204 in the memory array 200.

Figure 3:
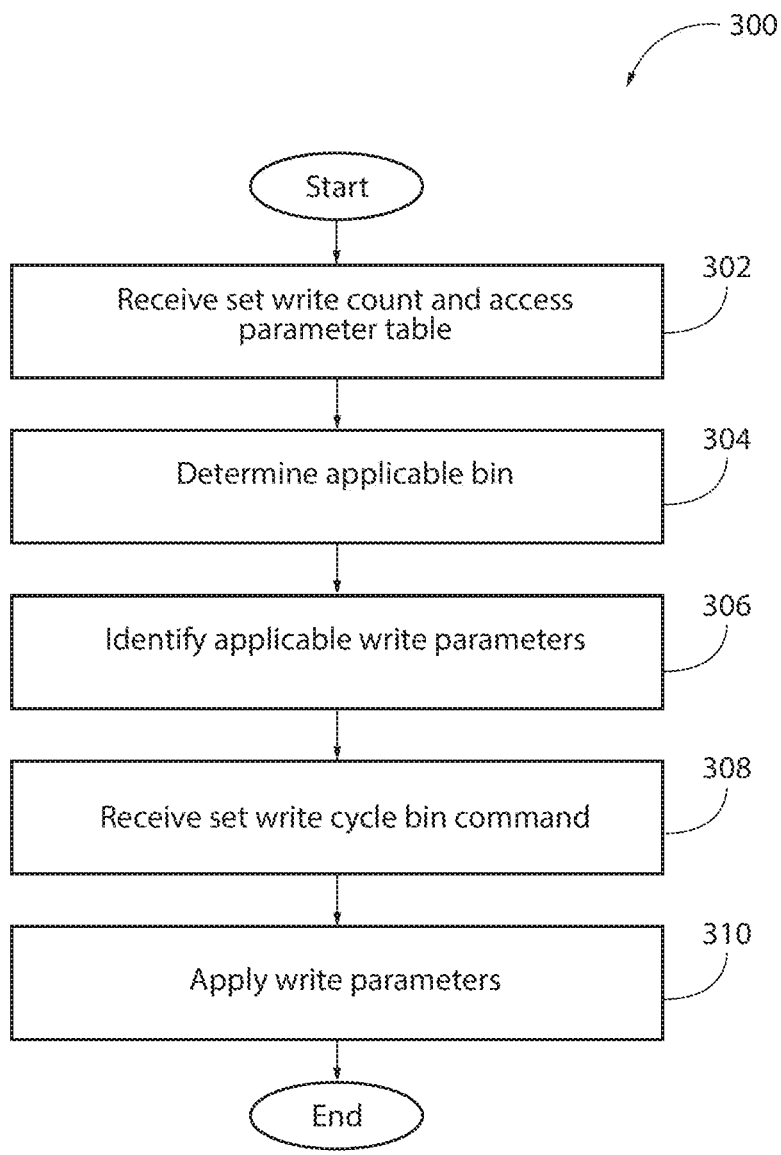
FIG. 3 is a flowchart of a method of setting write parameters based on a write count, in accordance with an embodiment of the present invention.

FIG. 3 is a flowchart of a method 300 of setting write parameters based on a write count, in accordance with an embodiment of the present invention. In operation 302, the control logic 110 receives the current write count and accesses the parameter table 162 to read its contents. In various embodiments, the control logic 110 may be provided with the current write count stored on the write count circuit 106 by the processor. For example, the processor may access the write count circuit 106 and transmit the value stored thereon to the control logic 110 via I/O bus 128, I/O control circuit 120, and command bus 126. The control logic 110 may access the memory array 160 and read the contents of the parameter table 162, including the one or more write cycle bins and the associated write parameters of each bin. As described above with respect to FIG. 1, the parameter table 162 may be stored in the memory array 160. In some embodiments, the parameter table 162 may be stored in a dedicated subsection of the memory array, or in registers separate from the memory array 160. The control logic 110 may, in some embodiments, read the contents of the parameter table 162 to perform the set write cycle bin operation. In other embodiments, the contents of the parameter table 162 can be stored in a storage device, such as a register, a cache memory, or a random access memory, for reference in later set write cycle bin operations. As described above, in some embodiments, the write count circuit 106 may be located in the memory device 104 and coupled to the control logic 110. In such embodiments, the control logic 110 directly accesses the write count circuit 106 to determine the current number of write operations performed by the memory device 104, thereby eliminating the need of the processor 102 to transmit the current write count value to the control logic 110 during the set write cycle bin operation.

In operation 304, the control logic 110 determines the applicable write cycle bin based on the parameter table 162 and the current write count value, as received in operation 306. As described above, the parameter table 162 generally defines a number of write cycle bins based on the number of write operations that have been performed by the memory array 160. The control logic 110 compares the current write count (as stored in the write count circuit 106 and received in operation 306) with the write cycle bins in the parameter table 162 to determine into which bin or bins the current write count falls. For example, the current write count may be 10,560 write operations. The parameter table 162 may include a first bin having a range of 0 to 10,000 write operations and a second bin having a range of 1,000 to 100,000 write operations. In such an embodiment, the control logic 110 determines that the current write count (10, 560) is between 1,000 and 100,000, but not between 0 and 10,000. Therefore, the control logic 110 determines that the second bin is an applicable bin and the first bin is not an applicable bin.

Figure 4:
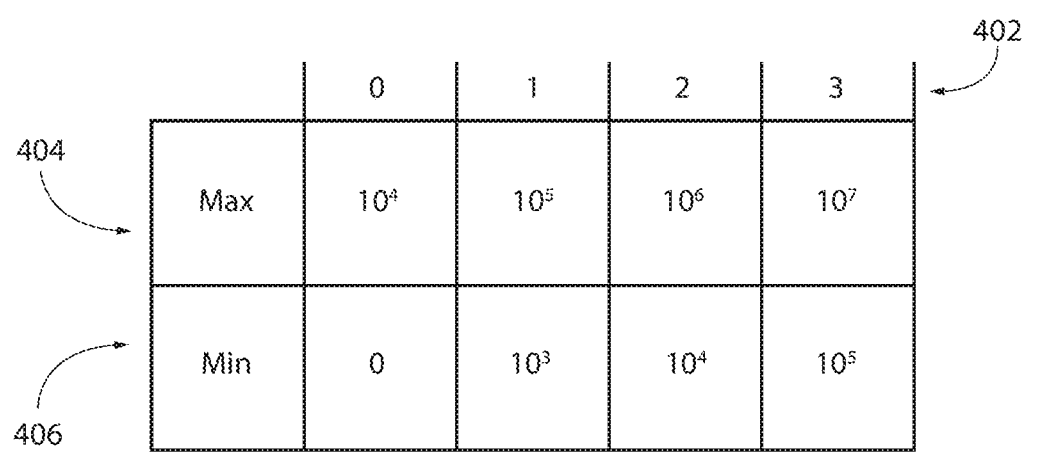

Referring now to FIG. 4, an example parameter table 400 is shown, in accordance with an embodiment of the present invention. In various embodiments, the parameter table 400 may be implemented as the parameter table 162 in the embodiment of FIG. 1. The parameter table 400 generally includes a plurality of bins 402, a maximum (max) write count 404, and a minimum (min) write count 406. In the embodiment of FIG. 4, the parameter table 400 has four bins: bins 0, 1, 2, and 3. Each of the bins 0, 1, 2, and 3 has an associated max write count 404 and min write count 406. The max write count 404 and min write count 406 define the size of each bin (i.e., the range over which each bin applies to the write count). For example, bin 0 has a min write count 404 of 0 write operations (i.e., a memory array that has never been written) and a max write count 406 of 10,000 write operations. Accordingly, if the control logic 110 determines in operation 304 that the write count has a value of between 0 and 10,000, then the control logic 110 identifies bin 0 as the applicable bin. Although four bins are shown in FIG. 4, those skilled in the art will appreciate that any number of bins may be used.

The bin ranges may overlap one another (e.g., by a factor of 10 or 100). For example, bin 1 of the example parameter table 400 has a range of 1,000 to 100,000 write operations, which overlaps with bin 0 by a factor of 10. The overlap range allows for variations in the actual number of write operations that may have been performed for a given block within the tolerances ranges of the wear levelling scheme. For example, the write count circuit 106 may store a value of 1,000 write operations. This write count falls within both bins 0 and 1. However, because of the wear levelling scheme, some blocks may have been written to less than 1,000 times, while others may have been written to 2,000 times or more. The overlap in bin range allows for wear leveling, which may not perfectly balance write operations among cells, but may ensure that all cells are written to within a certain range (e.g., no cell is written to more than a factor of 100 more times than any other cell). In some embodiments, the control logic 110 only identifies the higher bin once every block in the memory device 104 has been written to the minimum number of times for the higher bin. For example, the control logic 110 only recognizes bin 1 as applicable once every block of cells in the memory array 160 has been written to at least 1,000 times.

Returning again to FIG. 3, in operation 306, the control logic 110 identifies the applicable write parameters. As described above, each write cycle bin defined in the parameter table 162 is associated with a set of write parameters, such as write voltages. The control logic 110 identifies the applicable write parameters based on the applicable write cycle bin determined in operation 306. For example, if the control logic 110 determines that bin 1 (see FIG. 4) is the applicable bin, then the control logic 110 identifies the write parameters associated with bin 1 in operation 308. The write parameters associated with each bin may be stored in the memory device 104 and accessed in response to the determining the applicable bin. The applicable write parameters may include particular settings to be applied during a write operation. The particular settings may include a particular programming voltage (i.e., amplitude), pulse duration, pulse shape, leading edge, trailing edge, among other parameters. By adjusting these parameters, individually or in combination as the cells age, the likelihood of a successful write operation may be increased.

In operation 308, the memory device receives a set write cycle bin command. The control logic 110 may perform an operation to set a write cycle bin responsive to a command, for example, provided by the processor 102 and received by the control logic 110. In various embodiments, the set write cycle bin command may be received from the processor 102, a memory controller unit, an integrated memory controller, or other device. In other embodiments, the command to set the write cycle bin may be initiated as part of or in response to a power up operation of the memory device 104. In yet other embodiments, the command to set the write cycle bin may be provided periodically to ensure that the write cycle bin is consistent with the current number of write operations that have been performed on the memory array 160.

In operation 310, the control logic 110 applies the identified write parameters for the memory device 104. The control logic 110 applies the identified write parameters to all future write operations performed by the memory device 104 unless and until the applicable write cycle bin is changed. Once the applicable write parameters are identified, the control logic 110 may apply the identified applicable write parameters when performing write operations via the data I/O circuit 170. When a write operation is received (e.g., by the I/O control circuit 120) the control logic 110 performs the write operation on the memory array 160 using the identified write parameters. In one embodiment, the programming voltage may be increased (e.g., a higher amplitude). In another embodiment, the pulse duration may be increased. In yet another embodiment the shape of the pulse may be adjusted. In other embodiments, other write parameters may be adjusted in addition to, or instead of those discussed above. As the cells of the memory array 160 age, the write parameters may be further adjusted to reduce the likelihood of a failed write operation.

Figure 5:
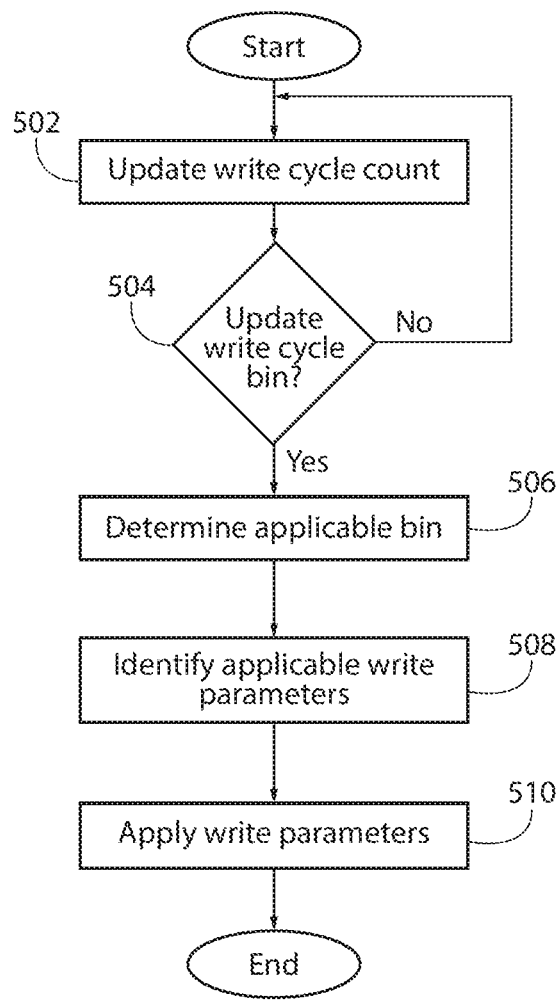
FIG. 5 is a flowchart of a method of updating the applicable bin number based on a write count, in accordance with an embodiment of the present invention.

FIG. 5 is a flowchart of a method 500 of updating the applicable bin number based on a write count, in accordance with an embodiment of the present invention. In operation 502, the control logic 110 updates the write cycle count stored in the write count circuit 106. The write count circuit 106 can be updated, for example, based on the amount of time since the write count was last updated (measured, for example, by clock cycles) and/or the number of write operations performed by the memory device 104 since the write count was last updated (e.g., the write count is updated for every 1,000 write operations performed by the memory device 104). In some embodiments, the memory device 104 may maintain an current count of write operations performed by the memory device 104 and update a write count circuit 106 external to the memory device 104 upon powering up the memory device. In another embodiment, the write count may be updated periodically (e.g., once per day). In some embodiments, the write count is updated after each write operation. In yet another embodiment, the write count circuit 106 is non-volatile and the write count may be updated as part of a power down operation of the memory device 104. In such embodiments, an updated write count is available immediately when powering up the memory device 104. By periodically updating the write count stored in the write count circuit 106, the memory device 104 ensures that the number of write operations used to determine which write parameters to apply to the memory array 160 is consistent with the actual number of write operations that have been performed.

In decision block 504, the control logic 110 determines whether to update the write cycle bin. In various embodiments, the control logic 110 may determine whether to update the write cycle bin based on a received command from the processor 102. In other embodiments, the control logic 110 may determine to update the write cycle bin in response to the memory device 104 being powered on. In yet another embodiment, the control logic 110 may determine to update the write cycle bin in response to a periodic signal. The periodic signal may be based, for example, on a clock signal, which prompts the control logic 110 to update the write cycle bin at regular intervals. If the control logic 110 determines not to update the write cycle bin (decision block 504, NO branch), then the control logic 110 continues to periodically update the write cycle count in operation 502.

Alternatively, if the control logic 110 determines to update the write cycle bin (decision block 504, YES branch), then the control logic 110 determines the applicable bin in operation 506. As described above with respect to operation 304 (FIG. 3), the control logic 110 of the memory device 104 can access the parameter table 162 and store the contents of the parameter table 162 in a memory, such as a register or a cache. The stored parameter table 162 may be accessed in operation 506 to update the bin information for the memory array 160. In operation, the control logic 110 accesses the updated write count stored in the write count circuit 106 and compares the write count to the bins defined in the parameter table 162. Based on the bin ranges defined by the parameter table 162, the control logic 110 determines one or more bins matching the updated write count. If the control logic 110 identifies more than one applicable bin in operation 506, then the control logic 110 selects a single bin to apply to the memory device 104 based on the write count for the blocks of the memory array 160. For example, the control logic 110 determines whether each of the blocks of the memory array 160 has been written to a number of times at least equal to the minimum write count of the higher bin number. If each of the blocks has been written to a number of times equal to at least the minimum write count of the higher bin number, then the higher bin is identified as the applicable bin. If at least one block has not been written to at least as many times as the minimum write count of the higher bin number, then the lower bin number is identified as the applicable bin.

In operation 508, the control logic 110 identifies the updated write parameters for the memory device 104 based on the applicable bin. This operation may be performed in the same manner as operation 306 of FIG. 3. Specifically, the control logic 110 determines the write parameters associated with the applicable bin by referencing the parameter table 162 or another memory location where the applicable parameters are stored. In operation 510, the control logic 110 applies the write parameters for the memory device 104 according to the updated identified write parameters, as determined in operation 508. The write parameters may be adjusted as described above with respect to operation 310. In some embodiments, the write parameters may remain the same, for instance, when the updated write count falls into the same bin as previously identified. In other embodiments, the write parameters may be adjusted for all future write operations performed by the memory array 160. By periodically updating the write parameters used by the memory array 160 when performing write operations, the control logic 110 reduces the risk of failed write operations and increases the ability of the memory device 104 to accurately store data.

What is claimed is:

1. An apparatus comprising:
    a cross-point memory array having a plurality of memory cells;
    memory access circuits coupled to the memory array and configured to perform write operations responsive to control signals;
    control logic coupled to the memory access circuits and configured to provide control signals to the memory access circuits to perform write operations on the plurality of memory cells according to a respective set of write parameters; and
    a parameter table including a range of write operations for each of a plurality of write cycle bins, wherein the parameter table includes a minimum number of write operations and a maximum number of write operations for each of the plurality of write cycle bins, each write cycle bin of the plurality of write cycle bins based on a respective tolerance range of a plurality of tolerance ranges for a wear leveling scheme among the plurality of memory cells,
    wherein the control logic is configured to select the respective set of write parameters of a plurality of sets of write parameters based on an identified number of the write operations performed by the memory access circuits, and further based on the range of the write operations for each of the plurality of write cycle bins, wherein a first minimum number of the write operations and a first maximum number of the write operations of a first range define a first write cycle bin of the plurality of write cycle bins, wherein a second minimum number of the write operations and a second maximum number of the write operations of a second range define a second write cycle bin of the plurality of write cycle bins, and wherein the first maximum number of the write operations overlaps with the second minimum number of number of the write operations.

2. The apparatus of claim 1, wherein a set of write parameters of the plurality of sets of write parameters includes at least one write parameter among a pulse shape, a leading edge of a puke, a trailing edge of a pulse, and a pulse duration.

3. The apparatus of claim 1, wherein the cross-point memory array is three dimensional (3D).

4. The apparatus of claim 1, wherein the cross-point memory array comprises a plurality of word lines and a plurality of bit lines.

5. The apparatus of claim 4, wherein the plurality of word lines are arranged parallel to one another.

6. The apparatus of claim 4, wherein the plurality of bit lines are arranged parallel to one another.

7. The apparatus of claim 4, wherein the plurality of bit lines and the plurality of word lines are stacked to form a 3D lattice structure.

8. The apparatus of claim 7, wherein, to form the 3D lattice structure, layers of bit lines of the plurality of bit lines are configured to alternate with layers of word lines of the plurality of word lines.

9. The apparatus of claim 1, wherein the plurality of memory cells comprises phase change memory cells.

10. The apparatus of claim 1, wherein a subset of memory cells of the plurality of memory cells is configured to store the parameter table.

11. The apparatus of claim 1, wherein the control logic is configured to compare the number of write operations performed by the memory access circuits to the plurality of write cycle bins to select the set of write parameters.

12. The apparatus of claim 1, further comprising a write count circuit configured to store the number of write operations performed by the memory access circuits in the cross-point memory array.

13. An apparatus comprising:
    a memory device including a plurality of memory cells and configured to store information on the plurality of memory cells based on a set of write parameters, and further including a parameter table, stored in a subset of the plurality of memory cells of the memory device, the parameter table configured to store a set of write cycle bins corresponding to the set of write parameters, each write cycle bin of the set of write cycle bins based on a respective tolerance range of a plurality of tolerance ranges for a wear leveling scheme among the plurality of memory cells,
    wherein a first minimum number of the write operations and a first maximum number of the write operations of a first range define a first write cycle bin of the set of write cycle bins, wherein a second minimum number of the write operations and second maximum number of the write operations of a second range define a second write cycle bin of the set of write cycle bins, and wherein the first maximum number of the write operations overlaps with the second minimum number of number of the write operations.

14. The apparatus of claim 13, wherein the set of write parameters comprises at least one of a programming voltage amplitude, pulse duration, pulse shape, a leading edge, and a trailing edge.

15. The apparatus of claim 13, wherein the parameter table includes a minimum number of write operations and a maximum number of write operations for each of the set of write cycle bins.

16. The apparatus of claim 13, wherein the set of write parameters is selected based on a number of write operations performed by the memory device and the set of write cycle bins.

17. A method comprising:
obtaining a number of write operations performed by a memory device;
obtaining a parameter table defining a plurality of write cycle bins, each write cycle bin of the plurality of write cycle bins based on a respective tolerances range of a plurality of tolerance ranges for a wear leveling scheme among memory cells of the memory device; and
selecting a write cycle bin of the plurality of write cycle bins based on the parameter table and the number of write operations,
wherein a first minimum number of the write operations and a first maximum number of the write operations of a first range define a first write cycle bin of the plurality of write cycle bins, wherein a second minimum number of the write operations and a second maximum number of the write operations of a second range define a second write cycle bin of the plurality of write cycle bins, and wherein the first maximum number of the write operations overlaps with the second minimum number of number of the write operations.

18. The method of claim 17, further comprising:
comparing the number of write operations to the plurality of write cycle bins to determine the write cycle bin.

19. The method of claim 17, further comprising:
providing a set of write parameters to the memory device based, at least in part, on the selected write cycle bin.

20. The method of claim 19, further comprising:
executing at least one write operation according to the set of write parameters.

21. The method of claim 19, wherein the set of write parameters comprises at least one of a programming voltage, pulse shape, leading edge, trailing edge, and pulse duration.

* * * * *

UNITED STATES PATENT AND TRADEMARK OFFICE
CERTIFICATE OF CORRECTION

PATENT NO. : 11,145,369 B2
APPLICATION NO. : 16/832061
DATED : October 12, 2021
INVENTOR(S) : Shekoufeh Qawami and Rajesh Sundaram It is certified that error appears in the above-identified patent and that said Letters Patent is hereby corrected as shown below:

In the Claims

| | Delete | Insert |
|---|---|---|
| Column 10, Line 7 Claim 2 | "a leading edge of a puke" | -- a leading edge of a pulse -- |

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*